United States Patent
Umayahara

(10) Patent No.: US 11,939,258 B2
(45) Date of Patent: Mar. 26, 2024

(54) GLASS POWDER, DIELECTRIC MATERIAL, SINTERED BODY, AND HIGH FREQUENCY CIRCUIT MEMBER

(71) Applicant: Nippon Electric Glass Co., Ltd., Shiga (JP)

(72) Inventor: Yoshio Umayahara, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 81 days.

(21) Appl. No.: 17/632,603

(22) PCT Filed: Jun. 19, 2020

(86) PCT No.: PCT/JP2020/024088
§ 371 (c)(1),
(2) Date: Feb. 3, 2022

(87) PCT Pub. No.: WO2021/024620
PCT Pub. Date: Feb. 11, 2021

(65) Prior Publication Data
US 2022/0289622 A1 Sep. 15, 2022

(30) Foreign Application Priority Data

Aug. 8, 2019 (JP) ................................. 2019-145899
May 11, 2020 (JP) ................................. 2020-083265

(51) Int. Cl.
| | | |
|---|---|---|
| B32B 3/10 | (2006.01) |
| C03C 3/089 | (2006.01) |
| C03C 4/16 | (2006.01) |
| C03C 12/00 | (2006.01) |
| C03C 14/00 | (2006.01) |
| H01B 3/08 | (2006.01) |
| H01B 3/12 | (2006.01) |

(52) U.S. Cl.
CPC ............ *C03C 14/004* (2013.01); *C03C 3/089* (2013.01); *C03C 4/16* (2013.01); *C03C 12/00* (2013.01); *H01B 3/087* (2013.01); *H01B 3/12* (2013.01); *C03C 2204/00* (2013.01); *C03C 2214/04* (2013.01); *C03C 2214/30* (2013.01)

(58) Field of Classification Search
None
See application file for complete search history.

(56) References Cited

U.S. PATENT DOCUMENTS

| | | | |
|---|---|---|---|
| 5,958,808 A | 9/1999 | Mori et al. | |
| 6,309,990 B2 * | 10/2001 | Tamura | ................. C03C 13/00 501/59 |
| 2001/0008864 A1 | 7/2001 | Tamura et al. | |
| 2009/0143214 A1 | 6/2009 | Niida et al. | |
| 2011/0207594 A1 | 8/2011 | Niida et al. | |

FOREIGN PATENT DOCUMENTS

| | | |
|---|---|---|
| JP | 06-263479 | 9/1994 |
| JP | 08-333137 | 12/1996 |
| JP | 09-241068 | 9/1997 |
| JP | 11-116272 | 4/1999 |
| JP | 2004-269269 | 9/2004 |
| TW | 450948 | 8/2001 |
| WO | 2007/020825 | 2/2007 |

OTHER PUBLICATIONS

International Search Report dated Sep. 8, 2020 in International (PCT) Application No. PCT/JP2020/024088.
International Preliminary Report on Patentability and Written Opinion of the International Searching Authority dated Feb. 8, 2022 in International (PCT) Patent Application No. PCT/JP2020/024088.
Chinese Office Action dated Oct. 26, 2022 issued in corresponding Chinese Patent Application No. 202080056009.8 with translation of the search report.

* cited by examiner

*Primary Examiner* — Christopher M Polley
(74) *Attorney, Agent, or Firm* — WENDEROTH, LIND & PONACK, L.L.P.

(57) ABSTRACT

A glass powder of the present invention is a glass powder, which is formed of alkali borosilicate glass, wherein the glass powder includes 0.1 mol % to 1.0 mol %, provided that 1.0 mol % is excluded, of $Li_2O+Na_2O+K_2O$ in a glass composition, has a molar ratio $Li_2O/(Li_2O+Na_2O+K_2O)$ of from 0.35 to 0.65, a molar ratio $Na_2O/(Li_2O+Na_2O+K_2O)$ of from 0.25 to 0.55, and a molar ratio $K_2O/(Li_2O+Na_2O+K_2O)$ of from 0.025 to 0.20, and has a specific dielectric constant at 25° C. and 16 GHz of from 3.5 to 4.0 and a dielectric dissipation factor at 25° C. and 16 GHz of 0.0020 or less.

6 Claims, 1 Drawing Sheet

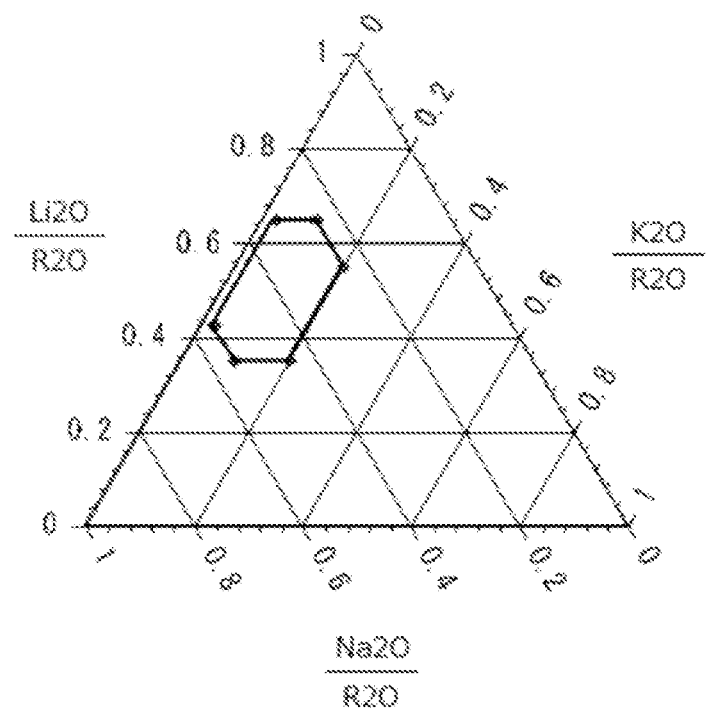

GLASS POWDER, DIELECTRIC MATERIAL, SINTERED BODY, AND HIGH FREQUENCY CIRCUIT MEMBER

TECHNICAL FIELD

The present invention relates to a glass powder, a dielectric material, a sintered body, and a high-frequency circuit member each having a low specific dielectric constant and a low dielectric dissipation factor in a high-frequency region of 10 GHz or more.

BACKGROUND ART

Alumina ceramic has been widely used as a wiring board or a circuit component. However, the alumina ceramic has a drawback of having a specific dielectric constant as high as 10 and having a slow signal processing speed. In addition, the alumina ceramic also has a drawback of having a large conductor loss because tungsten, which is a high melting point metal, is used as a conductor material.

In order to compensate for the drawbacks of the alumina ceramic, a dielectric material including a glass powder and a ceramic filler powder has been developed and used. For example, a dielectric material including a glass powder formed of alkali borosilicate glass has a specific dielectric constant of from 6 to 8, which is lower than the specific dielectric constant of the alumina ceramic. In addition, the dielectric material has a merit in that the dielectric material can be fired at a temperature of 1,000° C. or less, and hence can be fired simultaneously with a low melting point metal such as Ag or Cu having a small conductor loss, with the result that such low melting point metal can be used as an inner layer conductor (see Patent Literatures 1 and 2).

CITATION LIST

Patent Literature 1: JP 11-116272 A
Patent Literature 2: JP 09-241068 A

SUMMARY OF INVENTION

Technical Problem

Currently, developments are being made to adapt to the fifth-generation mobile communications system (5G), and technical investigations are underway for allowing the system to achieve higher speed, higher transmission capacity, and lower latency. A high-frequency radio wave is used in 5G communications. In addition, a material to be used for a high-frequency device for 5G communications is required to have a low dielectric constant and a low dielectric dissipation factor in order to reduce the loss of a transmission signal.

However, the dielectric material disclosed in each of the above-mentioned patent literatures has a problem of having a slow signal processing speed due to insufficient dielectric characteristics in a high-frequency region.

An object of the present invention is to provide a glass powder, a dielectric material, a sintered body, and a high-frequency circuit member, each of which can be fired at a temperature of 1,000° C. or less, and besides, has a low specific dielectric constant and a low dielectric dissipation factor in a high-frequency region.

Solution to Problem

The inventor of the present invention has repeated various experiments, and as a result, has found that a specific dielectric constant and a dielectric dissipation factor are remarkably reduced when the content of alkali metal oxides and the content ratios therebetween are strictly restricted in a glass powder formed of alkali borosilicate glass. Thus, the finding is proposed as the present invention. That is, a glass powder according to one embodiment of the present invention is a glass powder, which is formed of alkali borosilicate glass, wherein the glass powder comprises 0.1 mol % to 1.0 mol %, provided that 1.0 mol % is excluded, of $Li_2O+Na_2O+K_2O$ in a glass composition, has a molar ratio $Li_2O/(Li_2O+Na_2O+K_2O)$ of from 0.35 to 0.65, a molar ratio $Na_2O/(Li_2O+Na_2O+K_2O)$ of from 0.25 to 0.55, and a molar ratio $K_2O/(Li_2O+Na_2O+K_2O)$ of from 0.025 to 0.20, and has a specific dielectric constant at 25° C. and 16 GHz of from 3.5 to 4.0 and a dielectric dissipation factor at 25° C. and 16 GHz of 0.0020 or less. Herein, the "alkali borosilicate glass" refers to glass comprising alkali metal oxides, $SiO_2$, and $B_2O_3$ in a glass composition. The "$Li_2O+Na_2O+K_2O$" refers to the total content of $Li_2O$, $Na_2O$, and $K_2O$. The "$Li_2O/(Li_2O+Na_2O+K_2O)$" refers to a value obtained by dividing the content of $Li_2O$ by the total content of $Li_2O$, $Na_2O$, and $K_2O$. The "$Na_2O/(Li_2O+Na_2O+K_2O)$" refers to a value obtained by dividing the content of $Na_2O$ by the total content of $Li_2O$, $Na_2O$, and $K_2O$. The "$K_2O/(Li_2O+Na_2O+K_2O)$" refers to a value obtained by dividing the content of $K_2O$ by the total content of $Li_2O$, $Na_2O$, and $K_2O$. The "specific dielectric constant at 25° C. and 16 GHz" and the "dielectric dissipation factor at 25° C. and 16 GHz" refer to values each measured in conformity with a double-end short-circuit type dielectric resonator method (JIS R1627).

The glass powder according to the embodiment of the present invention comprises borosilicate glass as a basic composition and comprises 0.1 mol % or more of $Li_2O+Na_2O+K_2O$, and hence can be fired at a temperature of 1,000° C. or less. In addition, the content of the alkali metal oxides, which cause increases in specific dielectric constant and dielectric dissipation factor in the alkali borosilicate glass, is restricted to less than 1 mol %, and hence the increases in specific dielectric constant and dielectric dissipation factor in a high-frequency region can be suppressed to practically acceptable levels. Further, the content ratios between the alkali metal oxides are restricted as described above in the glass powder according to the embodiment of the present invention, and hence a mixed alkali effect is optimized, and the dielectric dissipation factor can be significantly reduced.

A dielectric material according to one embodiment of the present invention is preferably a dielectric material, comprising: 50 mass % to 100 mass % of a glass powder; and 0 mass % to 50 mass % of a ceramic filler powder, wherein the glass powder is the above-mentioned glass powder, and wherein the ceramic filler powder is one kind or two or more kinds selected from the group consisting of: α-quartz; α-cristobalite; β-tridymite; α-alumina; mullite; zirconia; and cordierite.

A sintered body according to one embodiment of the present invention is preferably a sintered body, which is obtained by sintering a dielectric material, wherein the dielectric material is the above-mentioned dielectric material.

In addition, the sintered body according to the embodiment of the present invention preferably has a specific dielectric constant at 25° C. and 16 GHz of from 3.5 to 6.0 and a dielectric dissipation factor at 25° C. and 16 GHz of 0.0030 or less.

A high-frequency circuit member according to one embodiment of the present invention is preferably a high-frequency circuit member, comprising a dielectric layer, wherein the dielectric layer is formed of the above-mentioned sintered body.

Advantageous Effects of Invention

The dielectric material of the present invention can be fired at a temperature of 1,000° C. or less, and hence a low melting point metal material such as Ag or Cu can be used as an inner layer conductor. Further, the dielectric material of the present invention has a low specific dielectric constant and a low dielectric dissipation factor in a high-frequency region. Accordingly, the dielectric material of the present invention is suitable as the high-frequency circuit member.

BRIEF DESCRIPTION OF DRAWINGS

FIG. 1 is a ternary diagram for illustrating the ranges of a molar ratio $Li_2O/(Li_2O+Na_2O+K_2O)$, a molar ratio $Na_2O/(Li_2O+Na_2O+K_2O)$, and a molar ratio $K_2O/(Li_2O+Na_2O+K_2O)$.

DESCRIPTION OF EMBODIMENTS

A glass powder of the present invention is a glass powder, which is formed of alkali borosilicate glass, wherein the glass powder comprises 0.1 mol % to 1.0 mol %, provided that 1.0 mol % is excluded, of $Li_2O+Na_2O+K_2O$ in a glass composition, and has a molar ratio $Li_2O/(Li_2O+Na_2O+K_2O)$ of from 0.35 to 0.65, a molar ratio $Na_2O/(Li_2O+Na_2O+K_2O)$ of from 0.25 to 0.55, and a molar ratio $K_2O/(Li_2O+Na_2O+K_2O)$ of from 0.025 to 0.20. The reasons why the contents of the components and the content ratios therebetween are limited as described above are described below. In the description of the glass composition, the expression "%" means "mol %".

The alkali borosilicate glass is desirably amorphous glass in which no crystal precipitates even through firing. This is because the amorphous glass has better softening fluidity than crystalline glass at the time of firing, and provides a dense sintered body more easily.

The alkali metal oxides ($Li_2O$, $Na_2O$, and $K_2O$) are each a component that improves meltability, and are each also a component that reduces the firing temperature of a dielectric material. When the content of $Li_2O+Na_2O+K_2O$ is large, a dielectric dissipation factor is increased, and a loss of a transmission signal is liable to be increased. Meanwhile, when the content of $Li_2O+Na_2O+K_2O$ is small, the meltability is liable to be reduced, and besides, it becomes difficult to fire the dielectric material at low temperature. Accordingly, the content of $Li_2O+Na_2O+K_2O$ is from 0.1% to less than 1.0%, preferably from 0.5% to 0.98%. The content of $Li_2O$ is preferably from 0.05% to 0.55%, particularly preferably from 0.2% to 0.5%. The content of $Na_2O$ is preferably from 0.05% to 0.5%, particularly preferably from 0.1% to 0.4%. The content of $K_2O$ is preferably from 0.01% to 0.3%, particularly preferably from 0.05% to 0.2%.

The molar ratio $Li_2O/(Li_2O+Na_2O+K_2O)$ is from 0.35 to 0.65, preferably from 0.4 to 0.6. The molar ratio $Na_2O/(Li_2O+Na_2O+K_2O)$ is from 0.25 to 0.55, preferably from 0.3 to 0.5. The molar ratio $K_2O/(Li_2O+Na_2O+K_2O)$ is from 0.025 to 0.20, preferably from 0.025 to 0.15. When the molar ratios fall outside the above-mentioned ranges, it becomes difficult to exhibit a mixed alkali effect, and the dielectric dissipation factor is liable to be increased.

When the ranges of the molar ratio $Li_2O/(Li_2O+Na_2O+K_2O)$, the molar ratio $Na_2O/(Li_2O+Na_2O+K_2O)$, and the molar ratio $K_2O/(Li_2O+Na_2O+K_2O)$ are illustrated in a ternary diagram, as illustrated in FIG. 1, the ranges correspond to a region enclosed by a point A (0.65, 0.325, 0.025), a point B (0.65, 0.25, 0.1), a point C (0.55, 0.25, 0.2), a point D (0.35, 0.45, 0.2), a point E (0.35, 0.55, 0.1), and a point F (0.425, 0.55, 0.025), each point being represented in terms of ($Li_2O/(Li_2O+Na_2O+K_2O)$, $Na_2O/(Li_2O+Na_2O+K_2O)$, $K_2O/(Li_2O+Na_2O+K_2O)$). A preferred region is a region enclosed by a point A' (0.60, 0.375, 0.025), a point B' (0.60, 0.30, 0.10), a point C' (0.55, 0.30, 0.15), a point D' (0.40, 0.45, 0.15), a point E' (0.40, 0.50, 0.1), and a point F' (0.475, 0.50, 0.025). The "$R_2O$" in FIG. 1 means the total content of $Li_2O$, $Na_2O$, and $K_2O$.

$SiO_2$ is a component that serves as a network former of the glass. When the content of $SiO_2$ is large, the firing temperature tends to be increased, and there is a risk in that Ag or Cu cannot be used as a conductor or an electrode. Meanwhile, when the content of $SiO_2$ is small, a specific dielectric constant is liable to be increased, and a signal processing speed may slow down. Accordingly, the content of $SiO_2$ is preferably from 65% to 85%, particularly preferably from 70% to 80%.

$B_2O_3$ is a component that reduces the viscosity of the glass. When the content of $B_2O_3$ is large, the glass is liable to undergo phase separation, and besides, the glass is liable to be reduced in water resistance. Meanwhile, when the content of $B_2O_3$ is small, the firing temperature tends to be increased, and there is a risk in that Ag or Cu cannot be used as a conductor or an electrode. Accordingly, the content of $B_2O_3$ is preferably from 15% to 40%, particularly preferably from 15% to 30%.

In addition to the above-mentioned components, components, such as $Al_2O_3$, MgO, and CaO, may each be added up to 3 mol % as long as dielectric characteristics are not impaired.

The glass powder of the present invention has a specific dielectric constant at 25° C. and 16 GHz of preferably from 3.5 to 4.0, particularly preferably from 3.6 to 3.9, and a dielectric dissipation factor at 25° C. and 16 GHz of preferably 0.0020 or less or 0.0015 or less, particularly preferably 0.0012 or less. When the specific dielectric constant or the dielectric dissipation factor is increased, a loss of a transmission signal is liable to be increased, and besides, a signal processing speed is liable to slow down.

A dielectric material of the present invention may be formed only of the above-mentioned glass powder formed of alkali borosilicate glass, but is preferably formed of a mixed powder obtained by adding a ceramic filler powder to the glass powder. The mixing ratio therebetween is preferably as follows: 50 mass % to 80 mass % (preferably 55 mass % to 80 mass %) of the glass powder and 20 mass % to 50 mass % (preferably 20 mass % to 45 mass %) of the ceramic filler powder. The reason why the ratio of the ceramic filler powder is limited as described above is as described below. When the ratio of the ceramic filler powder is high, it becomes difficult to density a fired body, and when the ratio of the ceramic filler powder is low, the flexural strength of the fired body is liable to be reduced.

A ceramic filler powder having a specific dielectric constant of 16 or less and a dielectric dissipation factor of 0.010 or less in a high-frequency region of 1 GHz or more is preferably used as the ceramic filler powder. For example, one kind or two or more kinds selected from the group consisting of: α-quartz; α-cristobalite; β-tridymite; α-alumina; mullite; zirconia; and cordierite may be used. With this configuration, the specific dielectric constant and dielectric dissipation factor of the dielectric material can be reduced in a high-frequency region.

The dielectric material (fired body) of the present invention has a specific dielectric constant at 25° C. and 16 GHz of preferably from 3.5 to 6.0, particularly preferably from 4.0 to 5.0, and a dielectric dissipation factor at 25° C. and 16 GHz of preferably 0.0030 or less, particularly preferably 0.0020 or less. When the specific dielectric constant or the dielectric dissipation factor is increased, a loss of a transmission signal is liable to be increased, and besides, a signal processing speed is liable to slow down.

A sintered body of the present invention is preferably a sintered body, which is obtained by sintering a dielectric material, wherein the dielectric material is the above-mentioned dielectric material. A method of manufacturing the sintered body of the present invention is described below.

First, a slurry is prepared by adding predetermined amounts of a binder, a plasticizer, and a solvent to the above-mentioned mixed powder of the glass powder and the ceramic filler powder. For example, a polyvinyl butyral resin, a (meth)acrylic acid resin, or the like may be suitably used as the binder. For example, dibutyl phthalate or the like may be suitably used as the plasticizer. For example, toluene, methyl ethyl ketone, or the like may be suitably used as the solvent.

Next, the slurry is formed into a green sheet by a doctor blade method. Further, the green sheet is dried and cut into predetermined dimensions. A via hole is formed in the green sheet through mechanical processing, and for example, a silver conductor or a low-resistant metal material serving as an electrode is printed on the via hole and the surface of the green sheet. After that, a plurality of such green sheets are laminated on each other and integrated with each other through thermocompression bonding.

The obtained laminated green sheets are fired to provide a sintered body. The sintered body thus produced comprises the conductor or the electrode in an inside thereof or on the surface thereof. A firing temperature is desirably 1,000° C. or less, particularly desirably from 800° C. to 950° C.

While the method of manufacturing the sintered body has been described above by using the example of using the green sheet, the present invention is not limited thereto. Various methods used for ceramic production, for example, a method involving producing granules each containing a binder, followed by press forming may be applied.

A high-frequency circuit member of the present invention is preferably a high-frequency circuit member, comprising a dielectric layer, wherein the dielectric layer is formed of the above-mentioned sintered body. Further, it is preferred that a coil be formed by wiring on the high-frequency circuit member, and it is also preferred that a Si-based or GaAs-based semiconductor device chip or the like be connected to the surface of the dielectric layer (sintered body) thereof.

EXAMPLES

The present invention is hereinafter described by way of Examples. However, the present invention is by no means limited to Examples below. Examples below are merely examples.

Examples (Sample Nos. 1 to 4 and 7 to 12) and Comparative Examples (Sample Nos. 5 and 6) of the present invention are shown in Tables 1 and 2. The "$R_2O$" in the tables means $Li_2O+Na_2O+K_2O$.

TABLE 1

| Sample No. | | 1 | 2 | 3 | 4 | 5 | 6 |
|---|---|---|---|---|---|---|---|
| Glass composition (mol %) | $SiO_2$ | 78.0 | 73.0 | 74.0 | 76.0 | 76.0 | 73.0 |
| | $B_2O_3$ | 21.2 | 26.02 | 25.5 | 23.7 | 23.2 | 25.0 |
| | $Li_2O$ | 0.32 | 0.49 | 0.25 | 0.18 | 0.56 | 1.10 |
| | $Na_2O$ | 0.40 | 0.39 | 0.225 | 0.105 | 0.16 | 0.60 |
| | $K_2O$ | 0.08 | 0.10 | 0.025 | 0.015 | 0.08 | 0.30 |
| | $R_2O$ | 0.8 | 0.98 | 0.5 | 0.3 | 0.8 | 2.0 |
| Molar ratio | $Li_2O/R_2O$ | 0.40 | 0.50 | 0.50 | 0.60 | 0.70 | 0.55 |
| | $Na_2O/R_2O$ | 0.50 | 0.40 | 0.45 | 0.35 | 0.20 | 0.30 |
| | $K_2O/R_2O$ | 0.10 | 0.10 | 0.05 | 0.05 | 0.10 | 0.15 |
| Dielectric characteristics of glass | | | | | | | |
| Specific dielectric constant | | 3.8 | 3.8 | 3.7 | 3.7 | 3.8 | 4.1 |
| Dielectric dissipation factor | | 0.0010 | 0.0011 | 0.0008 | 0.0006 | 0.0035 | 0.0025 |
| Ceramic filler powder (mass %) | | α-Quartz 37 | α-Cristobalite 33 | α-Alumina 32 | Cordierite 22 | Mullite 31 | α-Alumina 33 |
| Firing temperature (° C.) | | 870 | 900 | 900 | 920 | 880 | 900 |
| Dielectric constant | | 3.9 | 3.8 | 4.9 | 3.9 | 4.4 | 5.2 |
| Dielectric dissipation factor | | 0.0011 | 0.0012 | 0.0025 | 0.0017 | 0.0045 | 0.0050 |
| Thermal expansion coefficient (ppm/° C.) | | 6.0 | 5.5 | 5.0 | 4.6 | 5.2 | 5.3 |

TABLE 2

| Sample No. | | 7 | 8 | 9 | 10 | 11 | 12 |
|---|---|---|---|---|---|---|---|
| Glass composition (mol %) | $SiO_2$ | 80.0 | 81.0 | 82.0 | 72.0 | 71.0 | 70.0 |
| | $B_2O_3$ | 19.1 | 18.02 | 17.5 | 27.6 | 28.5 | 29.7 |
| | $Li_2O$ | 0.45 | 0.49 | 0.25 | 0.26 | 0.30 | 0.12 |
| | $Na_2O$ | 0.36 | 0.39 | 0.225 | 0.12 | 0.15 | 0.135 |
| | $K_2O$ | 0.09 | 0.10 | 0.025 | 0.02 | 0.05 | 0.045 |
| | $R_2O$ | 0.9 | 0.98 | 0.5 | 0.4 | 0.5 | 0.3 |

TABLE 2-continued

| Sample No. | 7 | 8 | 9 | 10 | 11 | 12 |
|---|---|---|---|---|---|---|
| Molar ratio $Li_2O/R_2O$ | 0.50 | 0.50 | 0.50 | 0.65 | 0.60 | 0.40 |
| $Na_2O/R_2O$ | 0.40 | 0.40 | 0.45 | 0.30 | 0.30 | 0.45 |
| $K_2O/R_2O$ | 0.10 | 0.10 | 0.05 | 0.05 | 0.10 | 0.15 |
| Dielectric characteristics of glass | | | | | | |
| Specific dielectric constant | 3.8 | 3.8 | 3.7 | 3.7 | 3.8 | 3.9 |
| Dielectric dissipation factor | 0.0008 | 0.0008 | 0.0008 | 0.0015 | 0.0016 | 0.0017 |
| Ceramic filler powder (mass %) | α-Quartz 29 | α-Cristobalite 33 | α-Alumina 32 | α-Quartz 29 | α-Cristobalite 33 | α-Alumina 32 |
| Firing temperature (° C.) | 850 | 870 | 900 | 840 | 840 | 830 |
| Dielectric constant | 3.9 | 3.8 | 4.9 | 3.9 | 4.2 | 5.2 |
| Dielectric dissipation factor | 0.0015 | 0.0014 | 0.0025 | 0.0017 | 0.0019 | 0.0027 |
| Thermal expansion coefficient (ppm/° C.) | 6.0 | 6.2 | 4.8 | 6.2 | 6.3 | 5.3 |

Each of the samples was produced in the following manner. First, various glass raw materials in the form of oxides were blended so as to have a glass composition in any one of the tables and mixed uniformly, and were then placed in a platinum crucible and melted at 1,550° C. to 1,650° C. for 3 hours to 8 hours. The resultant molten glass was formed into a thin sheet shape with a water-cooled roller. Next, the resultant glass film was crushed, and then wet pulverized with a ball mill after addition of an alcohol, and classified so as to have an average particle diameter of from 1.5 μm to 3 μm. Thus, a glass powder was obtained.

Next, the ceramic filler powder (average particle diameter: from 2 μm to 3 μm) shown in any one of the tables was uniformly mixed with the above-mentioned glass powder. Thus, a dielectric material was obtained.

Subsequently, a slurry was prepared by adding 15 mass % of polyvinyl butyral serving as a binder, 4 mass % of butylbenzyl phthalate serving as a plasticizer, and 30 mass % of toluene serving as a solvent to the above-mentioned dielectric material. Next, the slurry was formed into a green sheet by a doctor blade method, dried, and cut into predetermined dimensions. After that, a plurality of the green sheets were laminated on each other and integrated with each other through thermocompression bonding. Further, the resultant laminated green sheets were fired. Thus, a sintered body was obtained.

Each of the samples thus obtained was measured for the dielectric characteristics of the glass, and the firing temperature, dielectric characteristics, and thermal expansion coefficient of the dielectric material. The results are shown in Tables 1 and 2.

The specific dielectric constant and dielectric dissipation factor of the glass are values measured as described below. At the time of forming the molten glass into a thin sheet shape, part of the molten glass was poured out into a mold and formed into a rod shape, annealed, and then processed into a size measuring 13 mm in diameter and 6.5 mm in height. The resultant was measured for a specific dielectric constant and a dielectric dissipation factor at a temperature of 25° C. and a measurement frequency of 16 GHz based on a double-end short-circuit type dielectric resonator method (JIS R1627).

An ink was applied onto each of sintered bodies having been fired at various temperatures, and then wiped off. The firing temperature of a sintered body having been fired at the lowest temperature out of samples with no residual ink (=having been densely sintered) was described as the firing temperature of the dielectric material.

The specific dielectric constant and dielectric dissipation factor of the sintered body (dielectric material) are values measured as described below. The dielectric material in a powder form was press formed into a column measuring 13 mm in diameter and 6.5 mm in height, and was then fired at 830° C. to 920° C. to provide a measurement sample. The measurement sample was measured for a specific dielectric constant and a dielectric dissipation factor at a temperature of 25° C. and a measurement frequency of 16 GHz based on a double-end short-circuit type dielectric resonator method (JIS R1627).

The thermal expansion coefficient of the sintered body (dielectric material) is a value measured within the temperature range of from 30° C. to 300° C., and is a value measured with a thermomechanical analyzer.

As apparent from Tables 1 and 2, in each of Sample Nos. 1 to 4 and 7 to 12, the glass had a specific dielectric constant of from 3.7 to 3.9 and a dielectric dissipation factor of from 0.0008 to 0.0017, and hence the sintered body (dielectric material) had a specific dielectric constant of from 3.8 to 5.2 and a dielectric dissipation factor of from 0.0011 to 0.0027. In addition, in each of Sample Nos. 1 to 4 and 7 to 12, the firing temperature was 920° C. or less, and the thermal expansion coefficient was from 4.6 ppm/° C. to 6.3 ppm/° C.

Meanwhile, in Sample No. 5, in which the molar ratio $Li_2O/(Li_2O+Na_2O+K_2O)$ was high and the molar ratio $Na_2O/(Li_2O+Na_2O+K_2O)$ was low, the dielectric dissipation factor was 0.0045. In Sample No. 6, in which the content of $Li_2O+Na_2O+K_2O$ was 2 mol %, the dielectric dissipation factor was 0.0050.

The invention claimed is:

1. A glass powder, which is formed of alkali borosilicate glass, wherein the glass powder comprises 0.1 mol % to 1.0 mol %, provided that 1.0 mol % is excluded, of $Li_2O+Na_2O+K_2O$ in a glass composition, has a molar ratio $Li_2O/(Li_2O+Na_2O+K_2O)$ of from 0.35 to 0.65, a molar ratio $Na_2O/(Li_2O+Na_2O+K_2O)$ of from 0.3 to 0.55, and a molar ratio $K_2O/(Li_2O+Na_2O+K_2O)$ of from 0.025 to 0.15, and has a specific dielectric constant at 25° C. and 16 GHz of from 3.5 to 4.0 and a dielectric dissipation factor at 25° C. and 16 GHz of 0.0020 or less.

2. A dielectric material, comprising:
50 mass % to 100 mass % of a glass powder; and
0 mass % to 50 mass % of a ceramic filler powder, wherein the glass powder is the glass powder of claim 1, and wherein the ceramic filler powder is one kind or two or more kinds selected from the group consisting of: α-quartz; α-cristobalite; β-tridymite; α-alumina; mullite; zirconia; and cordierite.

3. A sintered body, which is obtained by sintering a dielectric material, wherein the dielectric material is the dielectric material of claim 2.

4. The sintered body according to claim 3, wherein the sintered body has a specific dielectric constant at 25° C. and 16 GHz of from 3.5 to 6.0 and a dielectric dissipation factor at 25° C. and 16 GHz of 0.0030 or less.

5. A high-frequency circuit member, comprising a dielectric layer, wherein the dielectric layer is formed of the sintered body of claim 3.

6. A high-frequency circuit member, comprising a dielectric layer, wherein the dielectric layer is formed of the sintered body of claim 4.

\* \* \* \* \*